US008836660B2

(12) United States Patent
Sano et al.

(10) Patent No.: US 8,836,660 B2
(45) Date of Patent: Sep. 16, 2014

(54) TACTILE DISPLAY AND CAD SYSTEM

(75) Inventors: Akihito Sano, Motosu-gun (JP);
Yoshihiro Tanaka, Nagoya (JP); Hideo Fujimoto, Nagoya (JP); Eisuke Kajisa, Toyota (JP); Kenji Wada, Toyota (JP)

(73) Assignees: Toyota Jidosha Kabushiki Kaisha, Toyota-Shi (JP); National University Corporation Nagoya Institute of Technology, Nagoya-Shi (JP)

( * ) Notice: Subject to any disclaimer, the term of this patent is extended or adjusted under 35 U.S.C. 154(b) by 185 days.

(21) Appl. No.: 13/498,813

(22) PCT Filed: Sep. 28, 2009

(86) PCT No.: PCT/JP2009/066745
§ 371 (c)(1),
(2), (4) Date: Mar. 28, 2012

(87) PCT Pub. No.: WO2011/036787
PCT Pub. Date: Mar. 31, 2011

(65) Prior Publication Data
US 2012/0188192 A1    Jul. 26, 2012

(51) Int. Cl.
G06F 3/041    (2006.01)
G03B 21/00    (2006.01)
G06F 3/01    (2006.01)
G06F 17/50    (2006.01)

(52) U.S. Cl.
CPC ............... *G06F 3/016* (2013.01); *G06F 17/50* (2013.01); *G03B 21/003* (2013.01); *G06F 3/011* (2013.01)
USPC ...................................................... 345/173

(58) Field of Classification Search
None
See application file for complete search history.

(56) References Cited

U.S. PATENT DOCUMENTS

| 5,512,919 | A | 4/1996 | Araki |
| 7,591,166 | B2 * | 9/2009 | Ueda et al. .......................... 73/9 |
| 7,802,314 | B2 * | 9/2010 | Cohen .............................. 2/161.1 |
| 2006/0094989 | A1 * | 5/2006 | Scott et al. ......................... 601/5 |
| 2009/0244031 | A1 * | 10/2009 | Westerman et al. ........... 345/174 |

FOREIGN PATENT DOCUMENTS

| JP | 51-047832 A | 4/1976 |
| JP | 04-195213 A | 7/1992 |
| JP | 05-282095 A | 10/1993 |
| JP | 09-300251 A | 11/1997 |

(Continued)

OTHER PUBLICATIONS

Translation of International Preliminary Report on Patentability of PCT/JP2009/066745.
Translation of Written Opinion mailed Jan. 26, 2010 of PCT/JP2009/066745.

(Continued)

*Primary Examiner* — Joseph Feild
*Assistant Examiner* — Parul Gupta
(74) *Attorney, Agent, or Firm* — Kenyon & Kenyon LLP

(57) ABSTRACT

Provided is a technique capable of allowing a person to perceive a fine relief on an object surface clearly. A tactile device of a tactile display slides above an object. The tactile device comprises three rods which are free to move up and down. Lower ends of the rods are in contact with a surface of the object. Upper ends of respective rods touch a palmar-side skin equivalent to positions of three joints of a first finger or a second finger. When the tactile device is slid, upper ends of respective rods move up and down in accordance with a surface relief of the object. In response to the movement of the tactile device, the three rods push three finger joint positions of the palmar-side skin with a stroke equal to a height of the relief.

6 Claims, 6 Drawing Sheets

(56) References Cited

FOREIGN PATENT DOCUMENTS

| | | |
|---|---|---|
| JP | 11-167419 A | 6/1999 |
| JP | 2000-311047 A | 11/2000 |
| JP | 2003-248540 A | 9/2003 |
| JP | 2004-101677 A | 4/2004 |
| JP | 2004-318400 A | 11/2004 |
| JP | 2005-004058 A | 1/2005 |
| JP | 2006-047538 A | 2/2006 |
| JP | 2006-167867 A | 6/2006 |
| JP | 2007-256771 A | 10/2007 |
| JP | 2009-032139 A | 2/2009 |

OTHER PUBLICATIONS

English Abstract of JP S51-047832 published Apr. 23, 1976 (document already filed with IDS on Mar. 30, 2012).

Translation of International Search Report mailed Jan. 26, 2010 of PCT/JP2009/066745.

Monica Bordegoni et al.: "Design Products With Your Hands"; Proceedings of Virtual Concept 2005, Biarritz, France, Nov. 8-10, 2005, pp. 1-7.

O. Suzuki: "Research Project for Efficient Designing in Europe", Kikai to Kougu, Feb. 2008, pp. 29-33, with concise explanation of relevancy.

* cited by examiner

TACTILE DISPLAY AND CAD SYSTEM

This is a 371 national phase application of PCT/JP2009/066745 filed 28 Sep. 2009, the contents of which are incorporated herein by reference.

TECHNICAL FIELD

The present invention relates to a tactile display that provides people with information through tactile perception and a CAD system employing the tactile display.

BACKGROUND ART

A tactile display has been researched as one of a human machine interface of a computer. Many of conventional tactile displays have a plurality of pins arranged in a grid and is configured capable of adjusting the height of each pin (Patent document 1, for example). A person touches a relief composed of tips of a plurality of pins. The tactile display can provide the person with various types of information as tactile perception by changing a shape of the relief surface. In order to realize various surface shapes, it has been believed as preferable that the tactile display has more pins densely arranged.

The tactile display is not limited to a display that applies a tactile stimulus on a human by changing the surface shape of the relief. Patent document 2, for example, refers to a tactile display that adopts vibrational stimulation or electrical stimulation. Patent document 2 describes that such a tactile display can convey to a human a difference in surface roughness by applying the vibrational stimulation or electrical stimulation on a human fingertip.

A research which adapts a tactile display to a CAD system is known (Non patent document 1, for example). The CAD system adopts a tactile display having a structure in which a paddle is supported by an arm and the paddle is provided for shaving a surface of a workpiece. A movement of the paddle is input to a computer by way of a movement of the arm. Also, the CAD system displays, on a monitor, surface shape data of a workpiece stored in the computer as a virtual object model (a CAD model). The computer of the CAD system reproduces the movement of the paddle in a virtual spare in the computer, and calculates interference between the virtual object model and the paddle. The CAD system can convey to an operator a reaction force, using the arm, which the paddle receives by contacting with the virtual object model in the virtual space in the computer. The operator moves the paddle, as though he/she shaved the virtual object model while watching the monitor, then the CAD system modifies the virtual object model, i.e., the surface shape data in response to the movement of the paddle.

CITATION LIST

Patent Document

Patent Document 1 Japanese Patent Application Publication No. 2005-4058
Patent Document 2 Japanese Patent Application Publication No. 2003-248540

Non Patent Document

Non Patent Document 1 Monica Bordegoni, Umberto Cugini, "DESIGN PRODUCTS WITH YOUR HANDS", Proceedings of Virtual Concept 2005, Biarritz, France, Nov. 8-Nov. 10, 2005

SUMMARY OF INVENTION

Problem to be Solved

The conventional tactile display with the plurality of pins arranged is able to reconstruct a surface shape of an object precisely. Also, as disclosed in Patent document 2, the tactile display that applies the vibrational stimulation or electrical stimulation on the person may be able to convey surface roughness to the person. However, as far as the inventors of the application know, a tactile display which conveys a fine relief on an object surface to a person in a more easily understood manner than directly touching the object has not been researched so far except by the inventors of the application. A technique in Non patent document 1 does not provide the fine relief on the object surface in an easily understood manner, either. The technique in Non patent document 1 merely reconstructs the movement of the paddle of when the paddle is moved over the CAD model.

The present description provides a technique with which a person can perceive a fine relief on an object surface more clearly than directly stroking the fine relief on the object surface.

It is expected that this technique contributes to development or manufacture of a workpiece with the fine relief as seen in the aforementioned CAD system as one example. A workpiece is, for example, a body of an automobile or a mold to form a body. Traditionally, for example, a shape of the mold for the automobile body has been modified by an operator stroking its surface with one's palm to perceive the surface shape thereof. The quality of such operation has depended on the operator's degree of proficiency. If a technique disclosed in the present description makes it easier to perceive a fine relief of a mold surface, efficiency of such operation is expected to improve.

Solution to the Problem

A new tactile display that the present description discloses allows a person to perceive a fine relief of an object surface remarkably compared with a case in which the person strokes the object directly with one's palm. For example, when a person strokes directly with one's palm an object surface with a relief 100 millimeters in length and about 0.1 millimeters in height, it may be impossible for the person to perceive the relief clearly. The new tactile display allows the person to perceive such relief clearly. In addition, a term "relief" in the present description includes indent, other than projection. Therefore, the new technique that the present description discloses can apply on a person a clear tactile stimulus which indicates the presence of the relief regardless of whether the relief is moderately projecting or moderately indenting.

The knowledge which led the inventors to invent the new technique that the present description discloses, and the technical idea of the present description will be explained. When a person attempts to perceive a fine relief on the object surface, the person does not only touch the object surface but also strokes the object surface. Further, the person strokes the object surface with one's whole palm, not only with one's fingertip. That is, the person can perceive the slight relief more clearly when the person strokes the object surface with one's whole palm than only with one's fingertip. Although a mechanism of tactile perception in a brain has not fully unveiled yet, according to the knowledge of the inventors, it is assumed that the aforementioned tendency is caused by the relief on the object surface being perceived as a change in the curvature of the whole palm.

According to the inventors' consideration, the perception arising from the person stroking the object surface with one's palm is assumed to be brought mainly by a change in a finger joint angle. Therefore, the inventors thought that if they could make the person perceive the change in the finger joint angle, they would be able to allow clear perception of the fine relief on the object surface. As a result of various examinations, the inventors discovered that a person perceived remarkably that one's finger had bent regardless of whether one's finger had really bent or not when a local stimulus was applied on a finger joint position of one's palmar-side skin. Specifically, a force to physically push the skin is most preferable among any stimuli applied on the skin. However, it is assumed that the stimulus applied on the skin may be vibrational stimulation or electrical stimulation. A relationship between the stimulus perceived by the brain of the person and a physical movement of a human body has not been fully discovered. Therefore, it is a mere speculation but it is considered that a person perceives a finger joint angle to have changed regardless of whether one's finger really bent even if vibrational stimulation or electrical stimulation is locally applied on a position which corresponds to a finger joint position on one's palmar-side skin.

In a case when the person physically strokes the object surface with one's palm, the whole palmar-side skin of the fingers makes contact with the object surface and the person receives a stimulus from the whole skin of the fingers. Thus, the stimulus is relatively strongly perceived in the case when the stimulus is applied locally on the finger joint position of one's palmar-side skin compared with the case when the person physically strokes the object surface with one's palm. Hence, the person perceives the relief remarkably in the case when the finger joint position is locally pushed by a stroke equal to the height of the relief on the object surface compared with the case when the person directly strokes the object surface. The inventors verified the above finding by an experiment. The experiment will be explained as follows. Note that "the case when the finger joint position is locally pushed" can be rephrased as "the case when the finger joint position is locally displaced by an infinitesimal amount".

A schematic side view of an experimental apparatus is shown in FIG. 1. Referring to an object W1, a relief with the maximum height of 0.2 millimeters is formed over a length of 100 millimeters on an approximate center of a surface of the object W1. Note that the relief on the surface is exaggerated in FIG. 1. The object W1 is put on a table. A tactile device 2 is held on the table, supported by rollers 3 at both sides of the object W1. The tactile device 2 slides above the object W1 along a longitudinal direction of the object W1. Three rods 4a, 4b, and 4c which are free to move up and down are attached to the tactile device 2. Lengths of the rods are about 70 millimeters. In addition, the three rods are collectively called the rods 4. A roller is attached to a lower end of each rod 4. The lower ends of respective rods 4 make contact with a surface of the object W1 via the roller. When the tactile device 2 is slid, the lower ends of respective rods 4 move smoothly on the relief on the surface by the rollers. When the tactile device 2 is slid, an upper end of each rod 4 moves up and down in accordance with the relief on the surface of the object W1. Now, the stroke of each rod 4 in the vertical direction is strictly equal to a height of the relief. A testee puts one's hand H on an upper surface of the tactile device 2 so that each upper end of the rods 4 touches one's palmar-side skin equivalent to positions of a first finger joint J1, a second finger joint J2, and a third finger joint J3. Then, the testee moves the tactile device 2. The three rods 4 locally push three finger joint positions of the palmar-side skin with a stroke equal to the height of the relief in response to the movement of the tactile device 2. As a comparative experiment, the testee directly strokes the surface of the object W1. Although a number of the testees was a few dozen, all testees reported that they perceived the relief much more clearly in the case where they stroked through the tactile device 2 than the case where they directly stroked the surface of the object W1. By this experiment, it was verified that a person could perceive the relief on the object surface more clearly in the case where the finger joint position of one's palmar-side skin was locally stimulated than the case where the testee directly stroked the object surface. In addition, although the tactile device 2 actually has 9 stimulators as well as a tactile device 22 in FIG. 4 which will be described later, only three rods (stimulators) were explained in this section for the sake of simplicity. The rods 4 of the tactile device 2 correspond to stimulators which will be described later.

Also, in the experiment using the tactile device 2, the testees stated that they perceived the stimulus applied by the rods 4 as through it were the relief on the surface of the object W1 in spite of their receiving the stimulus about 70 millimeters above the surface of the object W1. That is to say, the experimental apparatus 1 allows the testees to perceive the relief on the surface of the object W1 more clearly than when they directly stroke the object surface with their palms, while creating perceptual illusion of stroking the surface of the object W1. The experimental apparatus 1 exactly corresponds to one embodiment of the new tactile display that the present description discloses. This tactile display (the experimental apparatus 1) locally applies the stimulus on at least one finger joint position of the human palmar-side skin in response to the movement of the human hand.

In the following description, the experimental apparatus 1 is rephrased as a tactile display 1. The structure of the tactile display 1 will be explained as follows in more details. The tactile display 1 has the tactile device 2. The tactile device 2 is wearable on a human hand. Here, "to wear" includes to place a hand on the tactile device 2. That is, "to wear" in the present description means that it is possible for the human hand to move together with the tactile device 2. The tactile device 2 has the rods 4 which apply a stimulus on at least one finger joint position of a human palmar-side skin. This tactile display 1 applies the stimulus on a finger joint position of the human palmar-side skin in response to the movement of the tactile device 2 (the movement of the human hand) when the tactile device 2 is moved on the object surface by a person.

The tactile display 1 applies a stimulus in accordance with a relief of a surface of an actual object by using a mechanical mechanism configured by the tactile device 2 and the rods 4. A similar tactile display may be configured by an actuator (a motor) and a controller (software) instead of the mechanical mechanism. That is, the tactile display may be configured by a sensor that detects the movement of the tactile device, a memory unit that stores surface shape data of an object, and a controller that controls the stimulator. The stimulator may be provided by the tactile device as mentioned above, and may be arranged so that the stimulator can locally apply the stimulus on the finger joint position of the human palmar-side skin. The memory unit may be included in the controller. The controller can be rephrased as a computer. The controller may place a virtual object model which is defined by the surface shape data in a virtual space. The controller then may determine a position of the tactile device on a surface of the virtual object model based on an output of the sensor. Further, the controller may apply the stimulus whose magnitude corresponds to a height of a relief at a surface position of the virtual object model whose position is equivalent to a finger joint position. The height of the relief on the surface of the virtual object model may be defined by the surface shape data.

As mentioned earlier, the rods 4 of the tactile display 1 correspond to the stimulators. In addition, the stimulators are not limited to the mechanical rods 4, and alternatively can be a device that pushes the skin with an actuator as mentioned above. The device to push the skin is most preferable as a stimulator, but the stimulator may be either a device to apply electrical stimulation on skin, or a device to apply vibration on skin. The surface shape data of the object may typically be CAD data. Also, it is acceptable that the surface shape data of the object does not represent the surface shape of the existent object necessarily precisely. The surface shape data can be, for example, the shape data of a workpiece under design. "The stimulus whose magnitude corresponds to a height of a relief on a surface of the virtual object model" may be a stimulus which pushes skin with a stroke equal to the height of the relief, or a stroke in proportion to the height of the relief. Alternatively, "the stimulus whose magnitude corresponds to a height of a relief on a surface of the virtual object model" may be a vibration with its amplitude in proportion to the height of the relief, or an electrical stimulus with its voltage in proportion to the height of the relief. Proportion relationships do not have to be precise. A stimulus whose magnitude corresponds to a nonlinearly converted height of the relief on the surface of the virtual object model is also acceptable in order to apply a tactile stimulus on a person to make the person perceive the relief with greater degree of clarity.

The present invention may be embodied as a method of displaying tactile perception that applies a local stimulus on a finger joint position of a human palmar-side skin in response to the movement of a human hand.

The present description may also provide a new CAD system which makes use of the aforementioned tactile display. The CAD system comprises the tactile display with the aforementioned controller and an input device connected to the controller. The controller modifies the height of the relief in the surface shape data (i.e. the virtual object model) where the position of the relief corresponds to the position of the stimulator of the tactile device in accordance with an operation amount by the person detected by the input device. At the same time, the controller applies the stimulus whose magnitude corresponds to a modified height of the relief on a finger joint position of a palmar skin. By modifying the height of the relief at each position, with the tactile device being moved to various positions, the shape of the relief in the surface shape data is modified. A dial type input device or a lever type input device which is able to detect a magnitude of an operation amount by the person as a continuous amount is most preferable as an input device. However, an input device may be replaced with a joystick and the like.

In the above-mentioned CAD system, the person manipulates a dial or a lever of the input device. The CAD system modifies the surface shape data in accordance with the operation amount detected by the input device as well as changing the magnitude of the stimulus. That is to say, by making use of the CAD system, the person can modify the surface shape data by manipulating the input device as well as perceiving the modified amount through the tactile display. The CAD system makes it possible to apply on the human palm the tactile perception that enables the person to perceive a slight change in the relief on the surface shape. At the same time, the CAD system can modify the surface shape data.

One of the main differences between the new CAD system which the present description discloses and the CAD system which Non patent document 1 discloses is that the former system instructs the system to modify the surface shape data by using the input device different from the tactile display, whereas the latter system uses the tactile display as the input device. The new CAD system which the present description discloses provides the operation amount by the person which is entered via the input device by using the tactile display which is able to perceive a fine relief clearly. Such a configuration realizes the CAD system that easily and finely modifies the surface shape data. However, it does not mean that the new tactile display which the present description discloses is limited to a device for giving the tactile perception. The technique of the new tactile display which the present description discloses can also be applied to an input device to enter information to a computer.

Advantageous Effects of Invention

According to one technique which the present description discloses, a person can perceive a fine relief on an object surface more clearly than a case where the person directly strokes the relief. Also, the other technique which the present description discloses provides the CAD system that easily and finely modifies the surface shape data.

DESCRIPTION OF EMBODIMENTS

Preferred Aspects of Invention

Several technical features of a tactile display in the embodiments will be noted. Main technical features of the tactile display in the embodiments are as mentioned above. Note that the experimental apparatus 1 described above is also one embodiment of the new tactile display which the present description discloses.

(Feature 1) A tactile device has a plurality of stimulators. The adjacent stimulators face toward adjacent finger joints, respectively at a palmar skin side when a person wears the tactile device. According to the inventors' investigation, the tactile display can make the person perceive a stimulus more clearly when the stimulus is applied on the adjacent finger joint positions on a palmar-side skin than the stimulus being applied on one finger joint position. "To locally apply a stimulus on a plurality of finger joint positions on a palmar skin" means "not to densely apply a stimulus at multipoint between two adjacent finger joint positions".

(Feature 2) A surface of the stimulator that contacts with a person finger curves with a curvature substantially equal to a curvature of a finger in a circumferential direction. According to the inventors' investigation, the tactile display can apply a tactile stimulus on the person to have the person perceive the relief on the object surface more clearly by applying the stimulus in line along the circumferential direction of a finger than applying a point-like stimulus on the finger joint position on the palmar-side skin. It is assumed that this is because the person can perceive the finger joint to have bent more acutely in the case of applying the stimulus in line along the circumferential direction of the finger than in the case of applying the point-like stimulus.

(Feature 3) The tactile device has a first portion that supports a person's fingertip and second portion that supports a part of a person's palm when the tactile device is worn by the person. The first portion and the second portion statically support the fingertip and a part of the palm, respectively. The part of the palm is preferable to be in the vicinity of a base of the finger. According to the inventors' investigation when the stimulus is to be locally applied on the finger joint position, the tactile stimulus that would make the person to more clearly perceive the relief can be applied by having the fingertip and the part of the palm supported. In the inventors' presumption, the person more clearly perceives the finger to bend by a dynamic stimulus being applied on the finger joint position, while both sides of the fingertip and the palm of a site on which the stimulus is applied being statically supported. According to the inventors' presumption, it seems that the person perceives the relief on the object surface when the finger bends with the whole palm touching the object surface.

Embodiment 1

Figure 1:
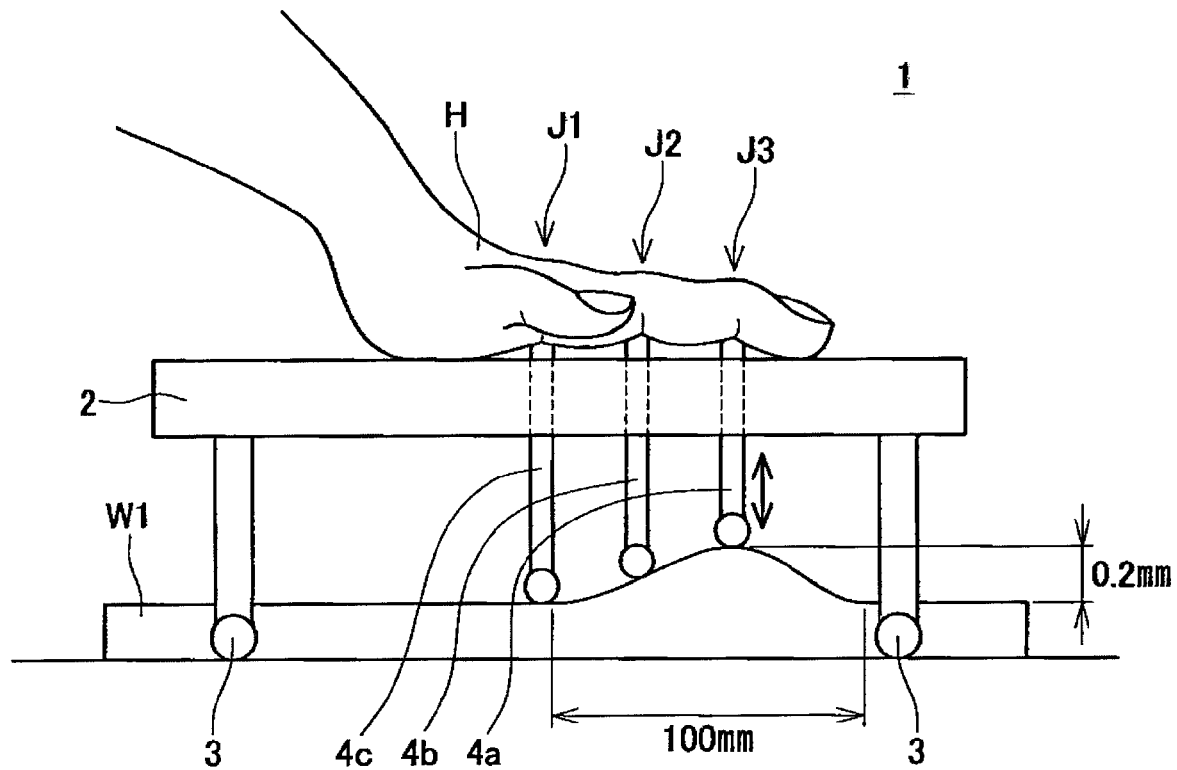
FIG. 1 shows a schematic view for explaining a principle of a tactile display.
Figure 2:
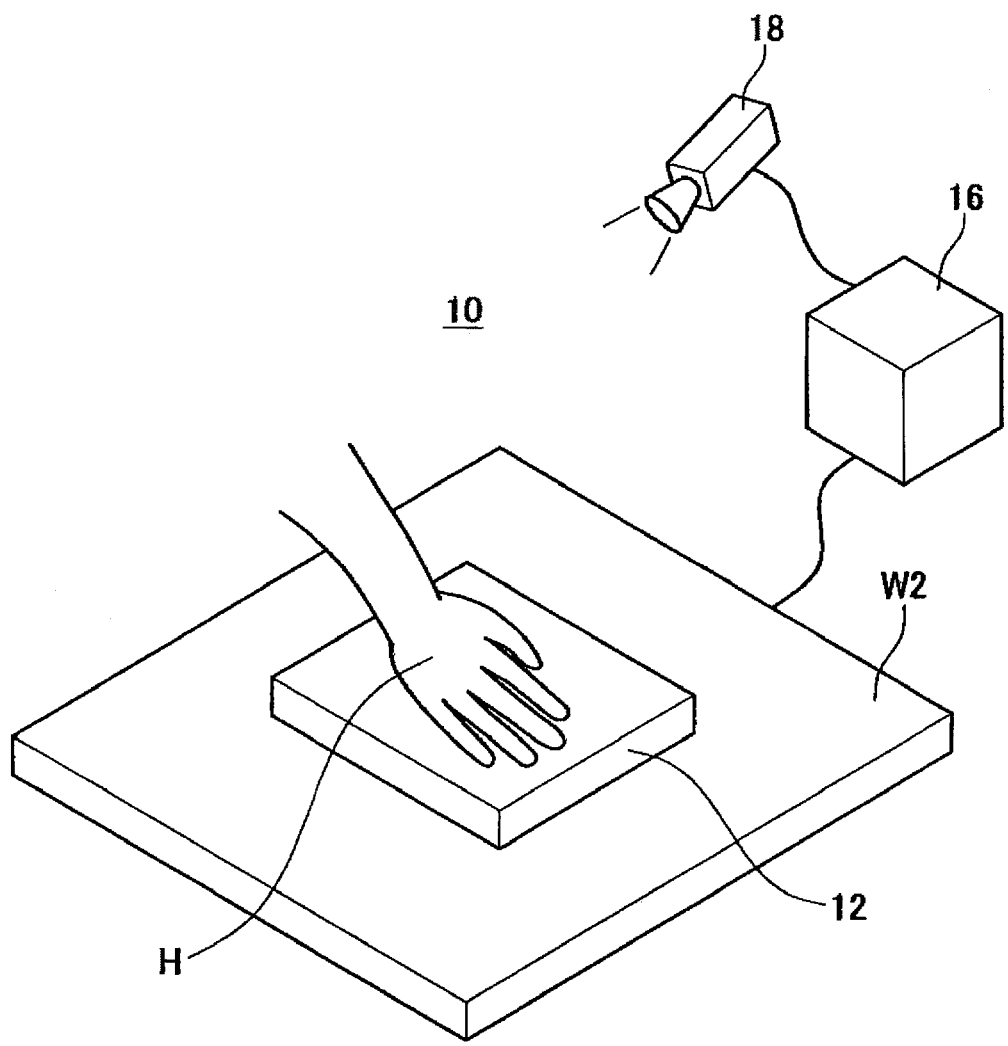
FIG. 2 shows a schematic perspective view of a tactile display in Embodiment 1.
Figure 3:
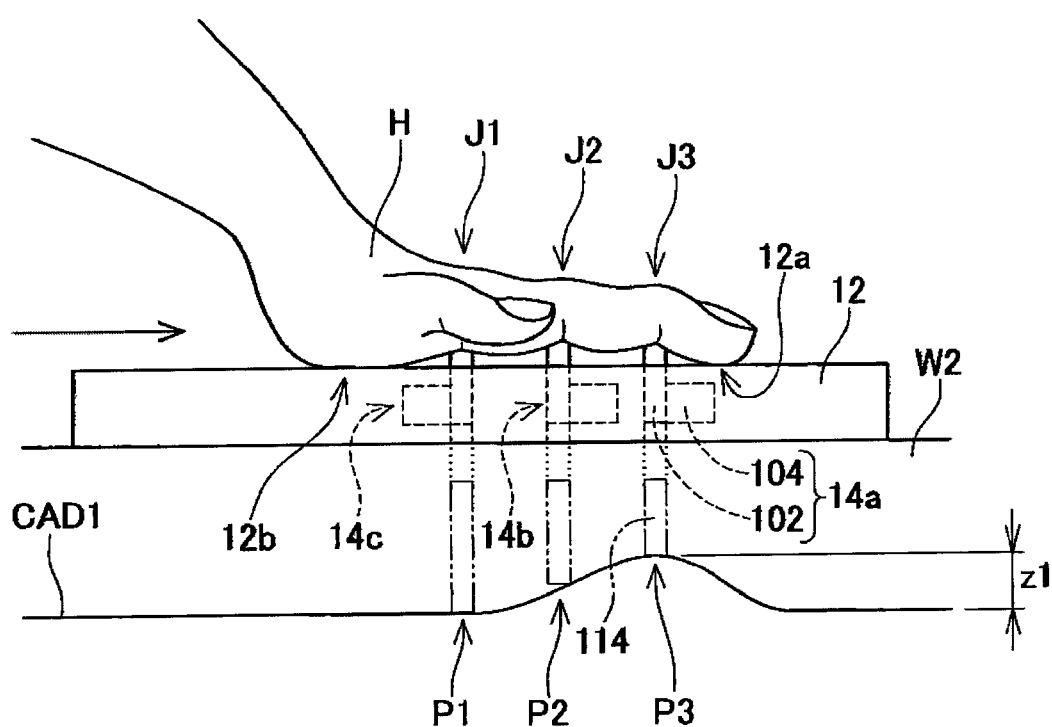
FIG. 3 shows a schematic side view of a tactile device in Embodiment 1.

FIG. 2 shows a schematic perspective view of a tactile display 10 in Embodiment 1. FIG. 3 shows a schematic side view of a tactile device 12. The tactile display 10 comprises the tactile device 12, a controller 16, and an image processing device 18. The tactile device 12 is wearable on a human palm. More specifically, the tactile device 12 can be moved on a surface of an object W2 with the person hand placed on the tactile device 12. A mark H in FIG. 2 and FIG. 3 indicates the person hand. The image processing device 18 detects a movement of the tactile device 12 with a camera. More specifically, the image processing device 18 detects a relative movement of the tactile device 12 to the object W2 from an image taken. At the same time, the image processing device 18 measures a position of the object W2 as well. The image processing device 18 corresponds to a sensor which detects the movement of the tactile device 12. Referring to an image processing algorithm for detecting the movement of a target, description will be omitted since various methods are widely known.

As shown in FIG. 3, the tactile device 12 has three stimulators 14a, 14b, and 14c. Each stimulator includes a rod 104 which projects upward from the upper surface of the tactile device 12 and an actuator 102 which moves the rod 104 up and down. Three stimulators 14a, 14b, and 14c are arranged at positions where each of three stimulators 14a, 14b, and 14c faces toward each finger joint J1, J2, and J3 when the person places the hand on the tactile device 12. In other words, adjacent stimulators are arranged, separated by a length equal to a distance between adjacent finger joints. Also, as shown in FIG. 3, the tactile device 12 has a first portion 12a which statically supports a person's fingertip and a second portion 12b which statically supports a part of a person's palm when the tactile device is worn by the person hand. The three stimulators 14a, 14b, and 14c are arranged between the first portion 12a and the second portion 12b in the tactile device 12.

The controller 16 controls the stimulators 14a, 14b, and 14c and moves each rod up and down in response to the movement of the tactile device 12 which the image processing device 18 measures. In other words, this tactile display 10 can apply a local stimulus on at least one finger joint position of the person palmar-side skin in response to the movement of the person hand, supporting the fingertip and a part of the palm of the person at the first portion 12a and the second portion 12b.

Also, the controller 16 stores surface shape data which describes an object surface shape. In the following description, the surface shape data will be also called as CAD data for the sake of simplicity. The controller 16 arranges a virtual object model defined by the CAD data in a virtual space. A symbol "CAD 1" in FIG. 3 indicates the surface shape of the virtual object model arranged in the virtual space. In addition, in a large sense, the CAD data is equal to the shape of the real object W1 which mounts the tactile device 12. However, the surface shape of the virtual object model does not represent a surface shape of the existent object W2 precisely. Specifically, although the surface of the existent object W2 is flat, the virtual object model in the CAD data has reliefs on the surface thereof as shown in FIG. 3.

The controller 16 overlaps a position of the existent object W2 with a position of the virtual object model in the virtual space based on an output from the image processing device 18. In other words, the controller 16 maps the movement of the tactile device 12 to the position of the virtual object model in the virtual space based on the output from the image processing device 18. Namely, in the virtual space, the tactile device 12 is positioned on the surface of the virtual object model. After such virtual space is constructed, the controller 16 determines a position of the tactile device 12 on the surface of the virtual object model based on the output from the image processing device 18. In more detail, the controller 16 determines a position of the stimulator on the surface of the virtual object model. For example, as shown in FIG. 3, the controller 16 determines a surface position P1 of the virtual object model which corresponds to the position of the stimulator 14c facing toward the finger joint J1. Likewise, the controller 16 determines surface positions P2 and P3 of the virtual object model which correspond to the positions of the stimulators 14b and 14a facing toward the finger joints J2 and J3, respectively. The controller 16, then, controls the actuator 102 so that each rod 104 projects from the surface of the tactile device 12 by a same length as a height of the relief on the determined surface position. For example, as an arrow in FIG. 3 shows, the controller 16 controls the rod 104 of the stimulator 14a to project by the length equal to the height of the relief Z1 while the tactile device 12 is actually moving by the distance from the surface positions P1 to P3.

The effect of the tactile display 10 will be described. When the person moves the tactile device 12 on the real object W2, the controller 16 maps the movement of the tactile device 12 to the virtual object model arranged in the virtual space, and moves the stimulators 14 up and down by the length corresponding to the height of the relief of the virtual object model. The stimulators 14 push the finger joint position of the person palmar-side skin by the length corresponding to the height of the relief. As the tactile device 12 moves, the height by which the stimulators 14 project changes in accordance with the relief on the virtual object model. That is, while the tactile device 12 is moving, the stimulators 14 apply on the person the stimulus which dynamically changes in accordance with the relief on the virtual object model. At this time, the person perceives a surface relief on the virtual object model (in the CAD data). In this case, the person can perceive the relief more acutely than a case of directly stroking the surface of the existent object.

Especially, the tactile device 12 arranges the stimulators between the first portion 12a which supports the fingertip and the second portion 12b which supports a part of the palm (the base of the finger, for example). The tactile display 10 can make the person perceive the change in the surface relief of the virtual object model clearly by applying the dynamic stimulus on the finger joint position between the fingertip and the part of the palm, while supporting the fingertip and the part of the palm statically. The reason for that is as described above.

Besides, an upper end of the rod 104 of each stimulator is positioned, as an initial position, at a slightly projected position from the surface of the tactile device 12. Therefore, in a case when the CAD data shows an indent on the object surface, the controller 16 lowers the upper end of the rod of the stimulator by the length corresponding to the depth of the indent. Through such operation, the tactile display 10 can make the person perceive the relief of the gradual indent of the surface shape of the virtual object model more clearly than the case when he/she directly strokes the relief.

According to the inventors' consideration, it was revealed that if the tactile device 12 could move smoothly on the object W2, that would make it easier for a person to perceive tactile perception receiving from the tactile device 12. Thus, it is preferable to apply a lubricant to the lower surface of the tactile device 12. Alternatively, it is preferable to paste a film with a small friction coefficient and the like to the lower surface of the tactile device 12.

Embodiment 2

Figure 4:
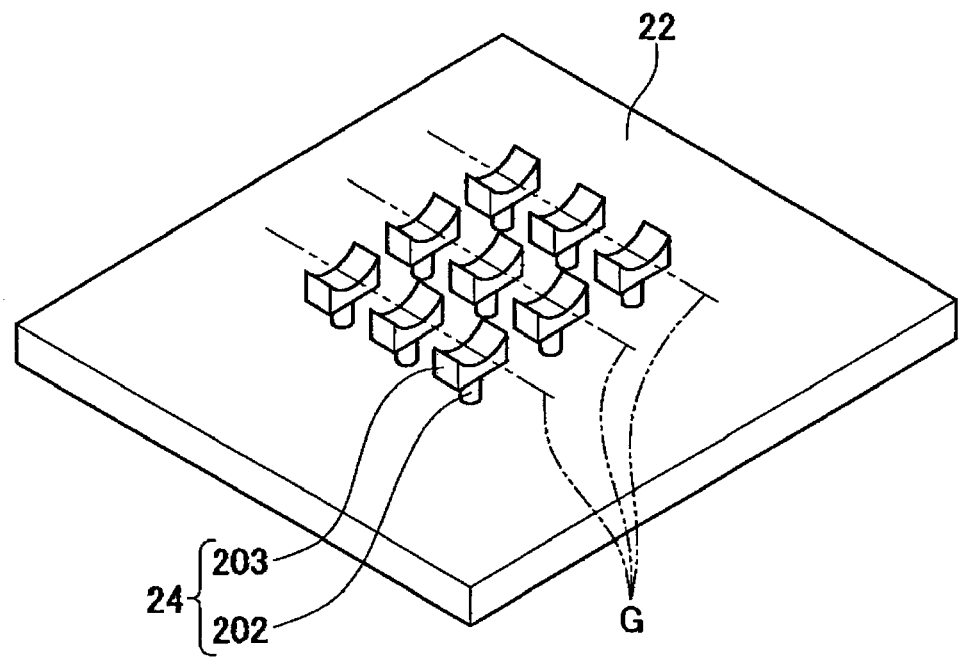
FIG. 4 shows a schematic perspective view of a tactile device of a tactile display in Embodiment 2.

A tactile display in Embodiment 2 will be described. The tactile display in Embodiment 2 comprises a tactile device 22 shown in FIG. 4 instead of the tactile device 12 in Embodiment 1. The tactile device 22 comprises nine stimulators 24. Each of the stimulators 24 comprises an actuator (not shown) as well as the stimulator 14 in Embodiment 1, and the upper end of the actuator moves up and down. Two adjacent stimulators among 9 stimulators 24 are arranged so that they face to positions of adjacent finger joints when a person places one's palm on the tactile device 22. When the person places the palm on the tactile device 22, each of the nine stimulators 24 faces toward a total of nine joints of the middle finger, the index finger, and the annular finger. Three virtual lines G in FIG. 4 schematically represent the middle finger, the index finger, and the annular finger of when the tactile device 22 is worn on the hand, respectively. Two adjacent stimulators are arranged, separated by a length equal to a distance between adjacent finger joints. Here, "adjacent finger joints" means both "two joints of one finger" and "the first (or the second or the third) joints of two adjacent fingers". In other words, the nine stimulators are arranged in a grid, and any two stimulators adjacent in all directions are arranged, separated by the length equal to the distance between adjacent finger joints.

Figure 5:
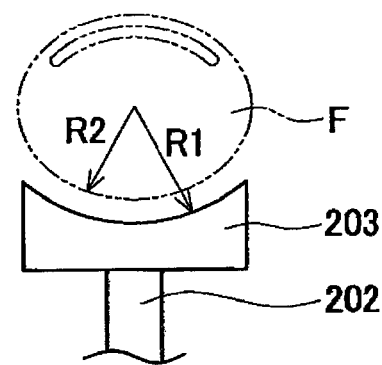
FIG. 5 shows an enlarged front elevational view of a stimulator of the tactile device in Embodiment 2.

The stimulator 24 comprises an attachment 203 on top of a rod 202 which moves up and down. A schematic enlarged front elevational view of the stimulator 24 is shown in FIG. 5. As shown in FIG. 5, the upper surface of the attachment 203 makes contact with a finger F when the person places the palm on the tactile device 22. A curvature radius R1 (a curvature 1/R1) of the upper surface of the attachment 203 is substantially equal to a curvature radius R2 (a curvature 1/R2) of the finger F in a circumferential direction. Such tactile display as equipped with a top of the stimulator which curves along the curved surface of a finger joint can make the person more clearly perceive a relief on an object surface than when the point-like stimulus is applied on the finger joint position of the palmar-side skin. The reason for that is as mentioned earlier.

Embodiment 3

Figure 6:
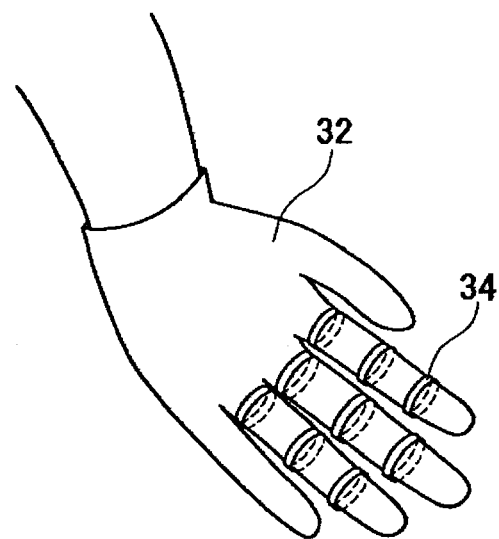
FIG. 6 shows a schematic perspective view of a tactile display in Embodiment 3.
Figure 7:
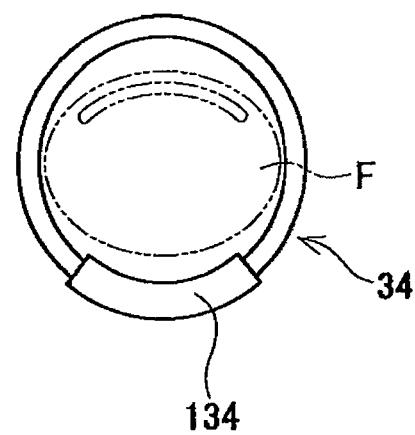
FIG. 7 shows an enlarged front view of a stimulator of the tactile display in Embodiment 3.

Embodiment 3 will be described, referring to FIG. 6 and FIG. 7. A tactile display in Embodiment 3 comprises a glove-type tactile device 32. The tactile display in Embodiment 3 comprises the image processing device 18 and the controller 16 in Embodiment 1. The description for them will be omitted. FIG. 6 shows a schematic perspective view of the tactile device 32. The tactile device 32 comprises a plurality of ring-shaped stimulators 34. As shown in FIG. 6, each of the stimulators 34 is arranged at a position corresponding to each joint position of fingers when the person wears the tactile device 32. A schematic enlarged front view of the stimulator 34 is shown in FIG. 7. As shown in FIG. 7, the stimulator 34 has an electrode 134. The electrode 134 faces toward the finger joint position of the palmar-side skin when the person wears the tactile device 32. Note that although the electrode 134 and the finger F are depicted apart in FIG. 7, the electrode 134 makes contact with the finger joint position of the palmar skin. Also, in respect to the electrode 134, the surface which contacts with the person finger F curves with a curvature substantially equal to the curvature of a finger in a circumferential direction.

The controller, similar to the tactile display 10 in Embodiment 1, applies an electric stimulus in response to the movement of the tactile device when the tactile device 32 is moved on the object surface by the person. A magnitude of the electric stimulus applied by the controller corresponds to the height of the surface relief of the virtual object model which the surface shape data describes. Note that the tactile device 32 comprises a contact sensor for detecting a contact with the real object surface although the contact sensor is not shown, and that the controller allows the application of a stimulus while the contact sensor is detecting a contact with the real object. The controller includes a memory unit storing the surface shape data of the object. The controller determines a position of the tactile device 32 on the surface of the virtual object model defined by the surface shape data based on the output of the image processing device, and the controller applies the electric stimulus whose magnitude corresponds to the height of the relief at the surface position of the virtual object model where the position thereof corresponds to a finger joint position. The tactile display in Embodiment 3 also has a similar effect to the tactile displays in Embodiment 1 and 2.

Moreover, the tactile display in Embodiment 3 has the glove-type tactile device 32. A person wears the tactile device 32 and strokes the surface of the real object. At this time, the tactile display applies on the person a stimulus which corresponds to the height of the relief on the virtual object model (in the surface shape data). The person can perceive the relief on the virtual object model on the surface of the real object, stroking the existent object.

Embodiment 4

Next, Embodiment 4 will be described. This embodiment is a CAD system 30 which applied the tactile display 10 in Embodiment 1. The CAD system 30 is used when designing a cavity wall of a mold. Namely, the surface shape data (the CAD data) which the controller 16 stores represents a surface shape on a cavity wall of a mold. Note that a computer in which software of CAD is installed is acceptable as the controller 16. The CAD system 30 enables an operator to perceive a change in the surface shape on the cavity wall caused by the modification of the CAD data through tactile perception.

Figure 8:
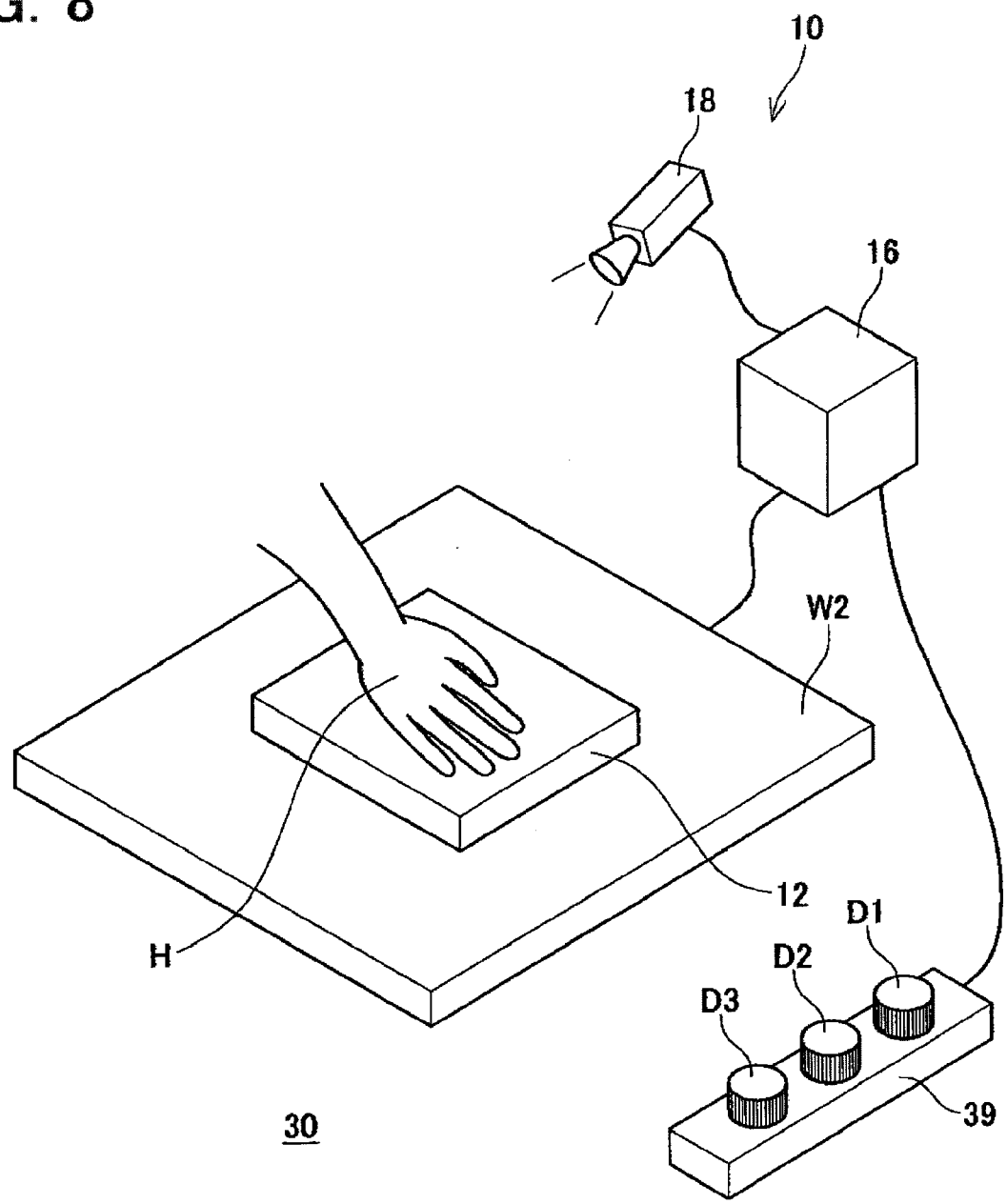
FIG. 8 shows a schematic perspective view of a CAD system in the Embodiments.

A schematic perspective view of the CAD system 30 is shown in FIG. 8. The CAD system 30 is a system that an input device 39 is added to the tactile display 10 of Embodiment 1. Description of the configuration of the tactile display 10 will be omitted because it has been described earlier. The controller 16 of the CAD system has the following function in addition to the function of the tactile display 10 of Embodiment 1. Note that an object W2 in the present embodiment is a mold manufactured experimentally, and that the tactile device 12 is placed on a cavity wall of the mold. For the sake of simplicity, FIG. 8 schematically shows the mold W2 as a simple rectangular parallelepiped.

An input device 39 operated by an operator is connected to the controller 16. The input device 39 has three dials D1, D2, and D3. When the operator operates the dial D1, the controller 16 modifies the height of the relief in the CAD data in accordance with the operation amount. Hereinafter, this function will be described in more detail.

The controller 16 detects the real mold W2 and the movement of the tactile device 12 relative to the mold W2 by using the image processing device 18. The controller 16 constructs a mold model based on the CAD data in the virtual space. The controller 16 overlaps the position of the real mold W2 with a position of the virtual mold model in the virtual space. Furthermore, the controller 16 takes in the movement of the tactile device 12 detected by the image processing device 18 as a movement in the virtual space. This is how the controller 16 simulates the tactile device which moves on the cavity wall of the virtual mold model in the virtual space.

The controller 16 maps the dial D1, D2, and D3 to three stimulators 14a, 14b, and 14c of the tactile device 12, respectively. Refer to FIG. 3 for the stimulators 14a, 14b, and 14c. The controller 16 determines a position on the cavity wall of the virtual mold model (the CAD data) on which the lower end of each stimulator is arranged in the virtual space. When the operator operates the dial D1, the controller 16, in accordance with the operation amount, changes a height of a relief at the surface position in the CAD data which corresponds to the position of the stimulator 14a in the virtual space. The controller 16 changes not only the position corresponding to the stimulator 14a, but also the height of the relief around the position in the CAD data. That is to say, the controller 16 changes the shape of the relief in the CAD data. The controller 16, putting a peak on the position corresponding to the stimulator 14a, modifies the height of the relief around the position in the CAD data, in accordance with the operation amount. The controller 16 modifies an intensity of a stimulus applied by each stimulator 14 corresponding to the height of the relief in the modified CAD data. Here, the intensity of the stimulus corresponds to the projection height of the rod 104 of the stimulator 14. Similarly, the controller 16 modifies the CAD data as well as adjusts the intensity of the stimulus applied by the stimulator 14, in accordance with the operation amount of the dial D2, or D3. In addition, a user of the CAD system 30 can modify the shape of the relief in the CAD data by modifying the height of the relief while changing a position of the tactile device 12.

The technical feature of the CAD system 30 can be expressed as follows. The CAD system 30 comprises any one of the tactile displays (the tactile displays with the controller) mentioned above, and the input device 39 connected to the controller 16 of the tactile display. The input device 39 is a device operated by a person. The tactile display comprises the sensor which detects the movement of the tactile device 12 (the image processing device 18), the memory unit storing the surface shape data of the object (the controller 16), and the controller 16 which controls the stimulators. The controller 16 places the virtual object model defined by the surface shape data (the CAD data) in the virtual space, and determines a position of the tactile device on the surface of the virtual object model based on the output of the sensor. Then, the controller 16 applies a stimulus whose magnitude corresponds to the height of the relief at the surface position of the virtual object model where the position thereof corresponds to the finger joint position. Further, the controller 16 modifies the height of the relief on the virtual object model (in the surface shape data) where the position thereof corresponds to the position of the stimulator of the tactile device in accordance with the operation amount by the person detected by the input device 39. Also, the controller 16 applies the stimulus whose magnitude corresponds to the modified height of the relief at the finger joint position of the palmar skin.

Advantages of the CAD system 30 will be described. Although a mold is manufactured based on the CAD data, a workpiece formed by the mold does not necessarily have an intended shape. Conventionally, an experienced operator repeatedly modified an existent cavity wall, stroking the surface of the mold so that a workpiece with an intended shape can be formed. In a case when the CAD system 30 of the present embodiment is applied, the operator can perceive the surface relief on the virtual cavity wall defined by the CAD data through the tactile device. When the operator operates the input device 39, the CAD system 30 modifies the CAD data which defines the cavity wall as well as provides the operator with the surface shape defined by the modified CAD data by means of the tactile device 12. When the operator, for example, turns the dial to the right, he/she perceives through the tactile device 12 that the height of the relief on the cavity wall in the CAD data increases. On the contrary, when the operator turns the dial to the left, he/she perceives through the tactile device 12 that the height of the relief on the cavity wall in the CAD data decreases. This is how the operator operates the input device and can further modify the CAD data if necessary while perceiving the result of modification through the tactile device 12 with a palm. With the mold which is manufactured using the finally modified CAD data, an intended workpiece can be formed.

The CAD system 30 in the present embodiment makes the operator perceive a change on the cavity wall caused by the modification of the CAD data through the tactile device as well as is able to reflect the modification on the CAD data.

The new tactile display which the present description discloses allows the person perceive the fine relief on the object surface more specifically than the case of directly stroking the fine relief on the object surface. "A fine relief" in the present description includes a slight relief of so-called "a surface distortion". In general, it is difficult for a person to perceive the surface distortion of less than about 1 millimeter difference in height by the direct stroking. The new tactile display which the present description discloses allows the person perceive the surface distortion more specifically than in the case of directly stroking such slight distortion.

Specific examples of the present invention are described above in detail, but these merely illustrate some possibilities of the teachings and do not restrict the scope of the claims. The art set forth in the claims includes variations and modifications of the specific examples set forth above. Further, the technical elements disclosed in the specification or the drawings have technical utility separately or in all types of combinations, and are not limited to the combinations set forth in the claims at the time of filing of the application. Furthermore, the art disclosed in the specification or the drawings may be utilized to simultaneously achieve a plurality of aims, and has technical utility by achieving any one of these aims.

REFERENCE SIGNS LIST

1: experimental apparatus (tactile display)
2, 12, 22, 32: tactile device
4: rod (stimulator)
10: tactile display
14, 24, 34: stimulator
16: controller
18: image processing device
30: CAD system
39: input device
102: actuator
104, 202: rod
134: electrode
203: attachment

The invention claimed is:

1. A tactile display that locally applies a stimulus on a finger joint position of a human palmar-side skin in response to a movement of a human hand, the display comprising:
a tactile device wearable on the human hand and having at least one extensible rod that extends from a surface of the tactile device and that has a tip positioned to face toward a finger joint;
a sensor that detects a movement of the tactile device;
a memory unit that stores surface shape data of the object; and
a controller that controls a stroke from the surface of the tactile device to the tip of each rod;
wherein the controller is programmed to place in a virtual space a virtual object that is defined by the surface shape data, and to determine a position of the tactile device on a surface of the virtual object model based on an output of the sensor,
wherein the controller is further programmed to determine the stroke of each rod in accordance with a height of a relief at a surface position of the virtual object corresponding to a position of each rod, and
wherein the controller is further programmed to push the tip of each rod toward each corresponding finger joint in accordance with the determined stroke of each rod.

2. The tactile display of claim 1, wherein two adjacent rods are arranged, separated by a length corresponding to a distance between adjacent finger joints.

3. The tactile display of claim 1, comprising a plurality of rods, each tip of which contacts with same types of joints of an index finger, a middle finger, and an annular finger.

4. The tactile display of claim 1, wherein a surface of the tip of each rod that contacts with a human finger curves with a curvature substantially equal to the curvature of the finger in a circumferential direction.

5. The tactile display of claim 1, wherein the tactile device comprises a first portion that supports a human fingertip and a second portion that supports a part of a human palm when the tactile device is worn by the person.

6. A CAD system comprising:
the tactile display of claim 1; and
an input device connected to the controller of the tactile display, wherein:
the controller modifies the height of the relief in the surface shape data in accordance with an operation amount by a person detected by the input device, the height of the relief corresponding to the position of each rod of the tactile device, and controls each rod so that the stroke corresponds to a modified height of the relief.

* * * * *